(12) United States Patent
O'Bryan

(10) Patent No.: US 11,064,640 B2
(45) Date of Patent: Jul. 13, 2021

(54) ARTICULATING SURFACE MOUNT TECHNOLOGY (SMT) FEEDER ARM

(71) Applicant: Schweitzer Engineering Laboratories, Inc., Pullman, WA (US)

(72) Inventor: John Christian O'Bryan, Moscow, ID (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 248 days.

(21) Appl. No.: 16/245,079

(22) Filed: Jan. 10, 2019

(65) Prior Publication Data

US 2020/0229333 A1 Jul. 16, 2020

(51) Int. Cl.
*H05K 13/04* (2006.01)
*H05K 13/02* (2006.01)

(52) U.S. Cl.
CPC ....... *H05K 13/0417* (2013.01); *H05K 13/022* (2013.01); *H05K 13/046* (2013.01)

(58) Field of Classification Search
CPC .............. H05K 13/021; H05K 13/022; H05K 13/0417; H05K 13/046
See application file for complete search history.

(56) References Cited

U.S. PATENT DOCUMENTS

| | | | |
|---|---|---|---|
| 6,178,620 B1* | 1/2001 | Yoshida | H05K 13/0452 29/740 |
| 7,668,280 B2* | 2/2010 | Hellandbrand, Jr. | G21C 3/32 376/254 |
| 8,118,584 B2* | 2/2012 | Yukawa | H01L 21/6835 425/369 |
| 2020/0229333 A1* | 7/2020 | O'Bryan | H05K 13/021 |

OTHER PUBLICATIONS

Universal Instruments Corporation, 51001906 Single FDR Index Station, Jul. 13, 2015.

* cited by examiner

*Primary Examiner* — Minh N Trinh
(74) *Attorney, Agent, or Firm* — Bradley W. Schield

(57) ABSTRACT

The present disclosure relates to a feeder arm for a surface mount technology (SMT) machine. In an embodiment, the feeder arm includes a support body that is fastened to an SMT machine. The feeder arm includes a reel loading body that supports a reel of electrical components to allow the reel to be prepared for installation on the SMT machine. The feeder arm includes preparation circuitry configured to electrically connect the reel to allow the reel to be prepared. The feeder arm includes an articulating joint between the reel loading body and the support body. The articulating joint may articulate the second body between a first position and a second position.

9 Claims, 6 Drawing Sheets

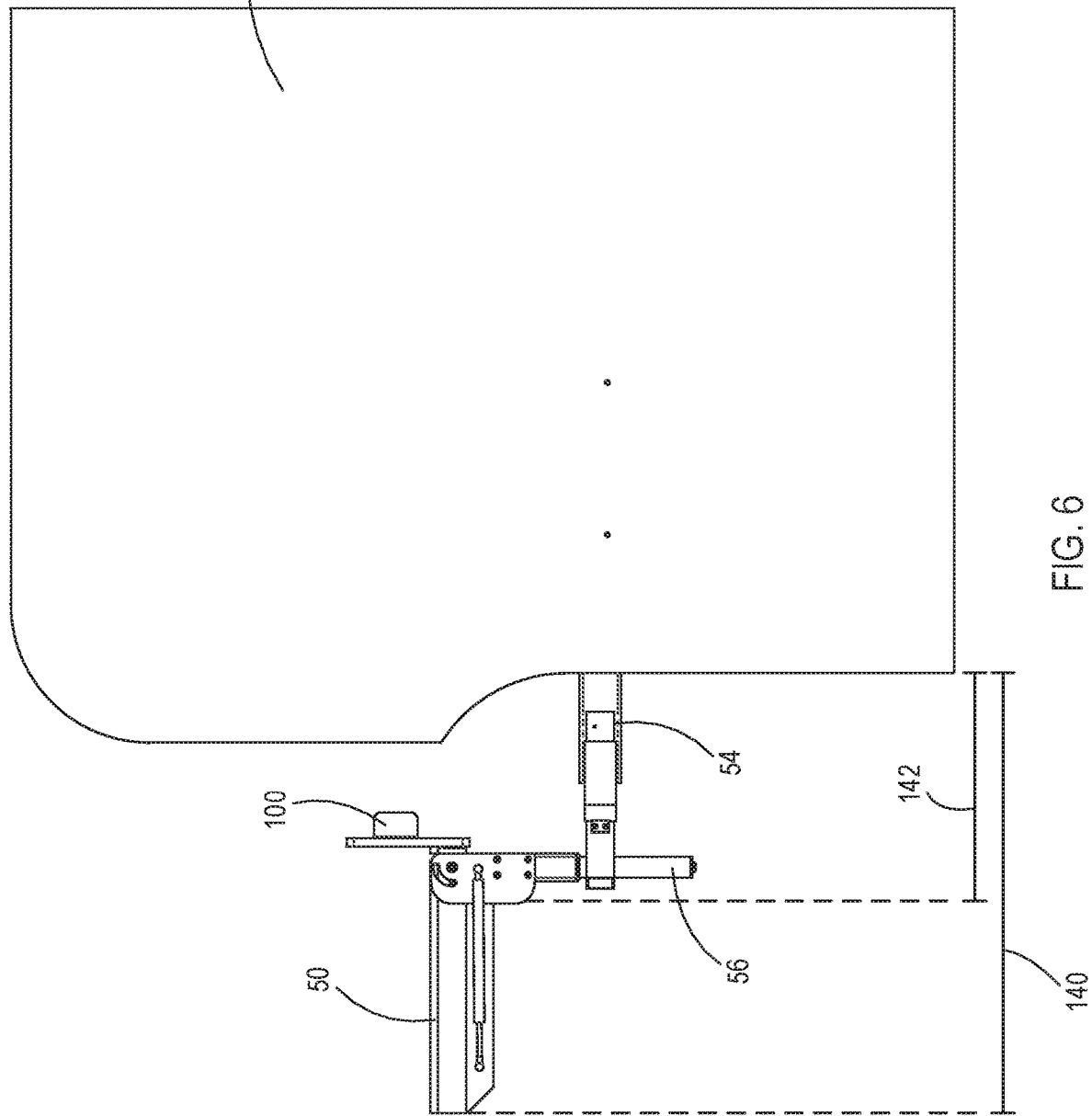

ARTICULATING SURFACE MOUNT TECHNOLOGY (SMT) FEEDER ARM

TECHNICAL FIELD

The present disclosure relates generally to surface mount technology (SMT) and, more particularly, to a feeder arm for preparing reels for an SMT machine.

BRIEF DESCRIPTION OF THE DRAWINGS

Non-limiting and non-exhaustive embodiments of the disclosure are described herein, including various embodiments of the disclosure with reference to the figures listed below.

FIG. 6 illustrates a side view of the SMT machine of FIG. 2 with the feeder arm in the first position, in accordance with an embodiment.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Manufacturing facilities may use surface mount technology (SMT) machines to manufacture surface mounted devices (SMDs). For example, an SMT machine may mount electrical components, such as resistors, capacitors, inductors, diodes, integrated circuits, or the like, onto a printed circuit board (PCB). The SMT machine may pick an electrical component from a reel of electrical components and place the electrical component onto the PCB. The mounted electrical components may then be soldered onto the PCB to join the electrical components to the PCB.

SMT machines may use a feeder arm to prepare the reels for use by the SMT machine. For example, the feeder arm may include preparation circuitry that powers up the reel assembly that allows an initial electrical component position to be set in memory of the reel. Further, the feeder arm may allow an operator to set a pitch between the subsequent electrical components into memory of the reel before the reel assembly is inserted into the machine to ensure that the SMT machine is able to acquire the initial part and each subsequent part from the reel.

Space may be limited in manufacturing facilities. For example, SMT machines may be part of a manufacturing process that involves processes that occur before and/or after the surface mounting process. In some cases, SMT machines may be placed adjacent to one another due to the limited space in the manufacturing facility. However, the feeder arm for some SMT machines may extend out beyond the body of the SMT machine. In manufacturing facilities that have limited space, the feeder arm may jut into a walkway, which may be inconvenient to operators to walk around. Further, some feeder arms may take up space to the side of the SMT machine which may prevent positioning the SMT machines adjacent to each other. For the foregoing reasons, there is a need for a low profile feeder arm for SMT machines.

Figure 1:
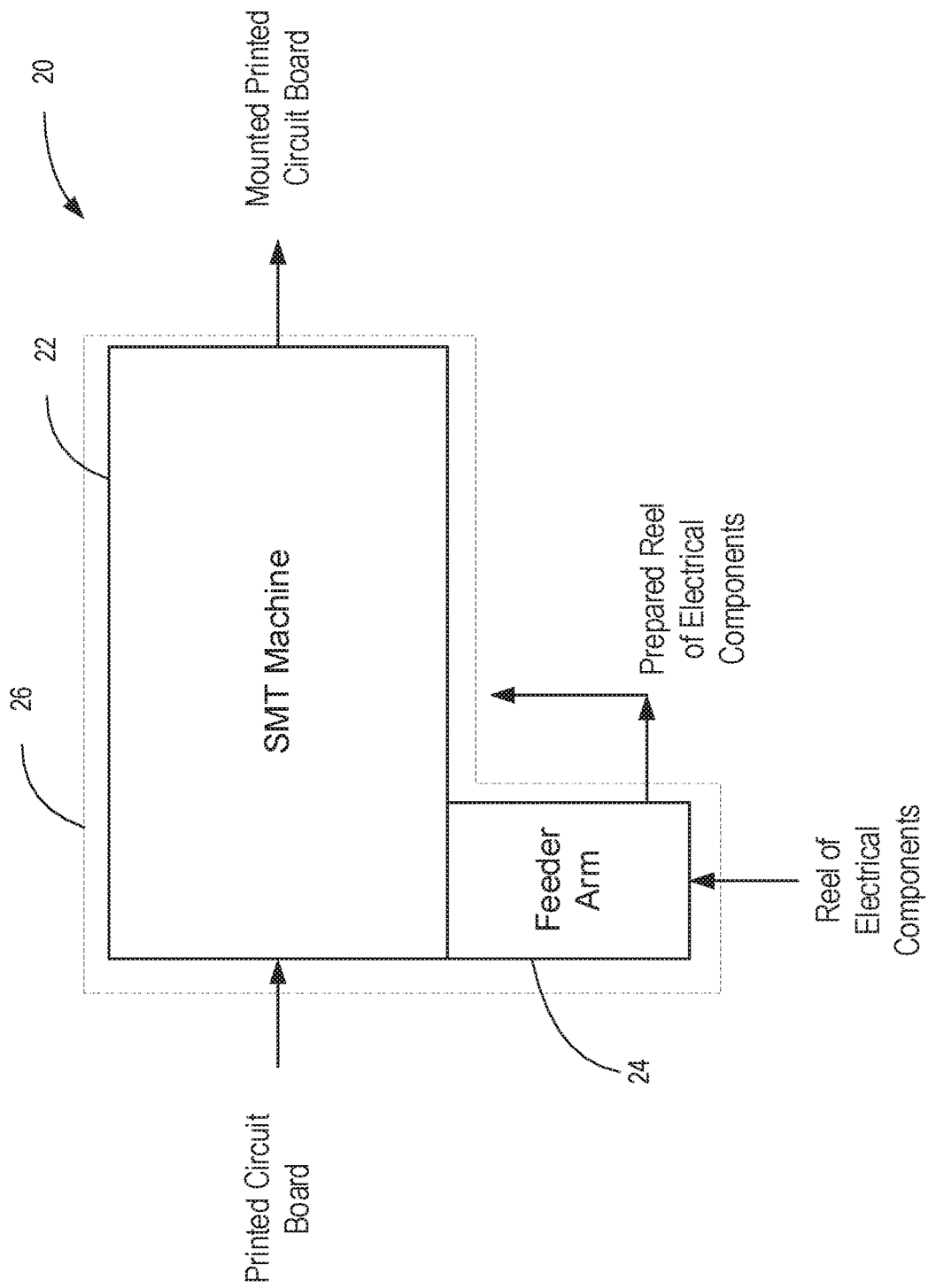
FIG. 1 illustrates a block diagram of a surface mount technology (SMT) machine that uses a feeder arm to prepare reels of the SMT machine.

FIG. 1 is a block diagram of a manufacturing facility 20 that uses an SMT machine 22 in manufacturing a PCB. The SMT machine 22 may include one or more reels of spooled electrical components that may be picked from the reels and placed onto the PCB by the SMT machine 22. The mounted electrical components on the PCB may be joined (e.g., soldered) onto the PCB using any suitable method. The SMT machine 22 includes a feeder arm 24 to prepare the reel before the reel is used by the SMT machine. An operator may connect a new reel to the feeder arm and input various settings into memory of the reel, as described above. As explained below, embodiments of the feeder arm may articulate to reduce a profile 26 of the SMT machine 22.

Figure 2:
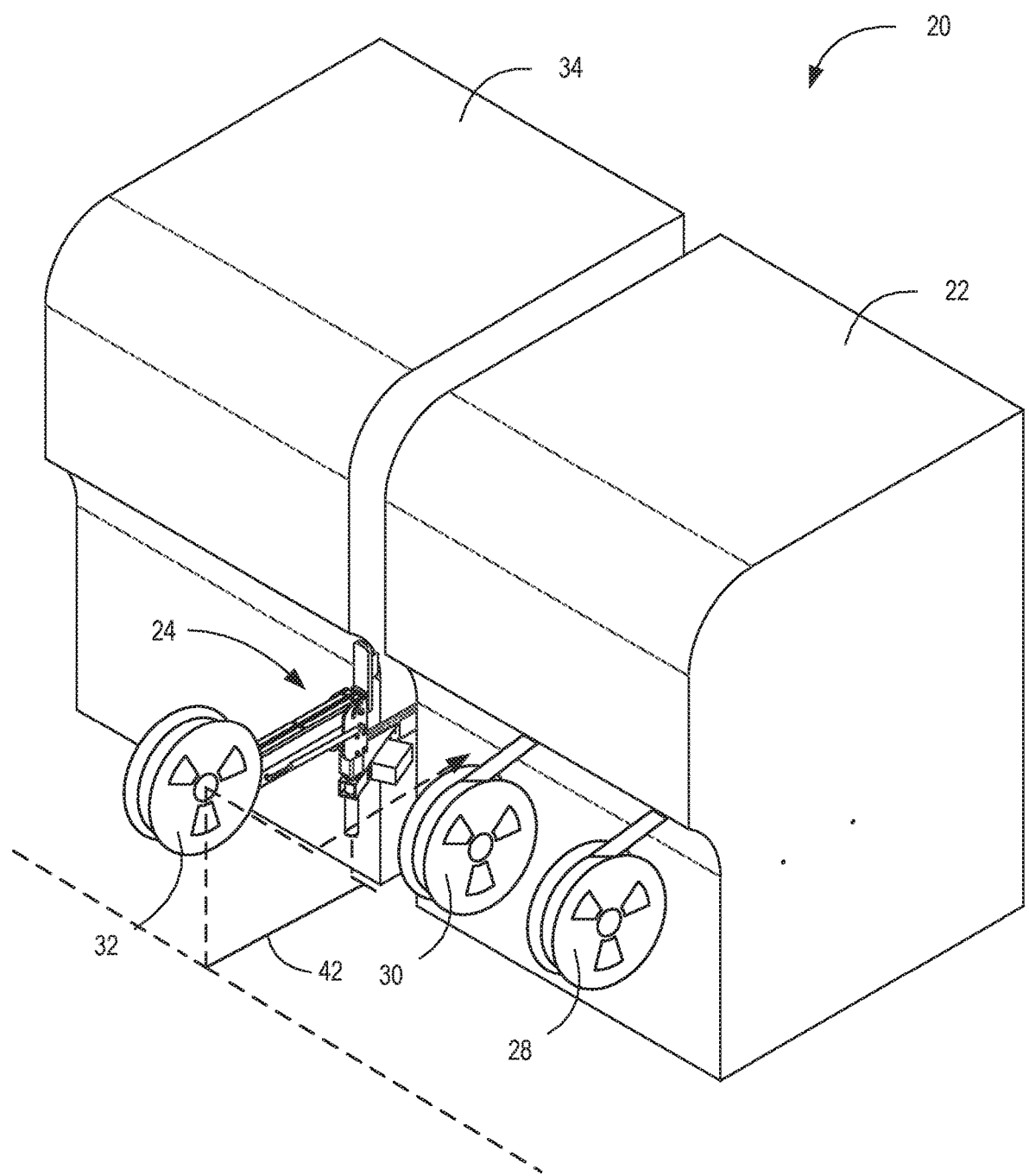
FIG. 2 illustrates a perspective view of an SMT machine that uses the feeder arm of FIG. 1, in accordance with an embodiment.

FIG. 2 is a perspective view of a manufacturing facility having an SMT machine 22 that uses a feeder arm 24 lowered into a first position to prepare a feeder, also referred to as a reel, for use by the SMT machine 22, in accordance with an embodiment. The SMT machine 22 includes reels 28 and 30 that have electrical components to be picked and placed onto the PCB. While two reels 28 and 30 are shown, this is simply meant to be used as an example and any suitable number of reels may be equipped to the SMT machine. When in the first position, the feeder arm 24 extends from the SMT machine 22 to allow an operator to prepare the reel 32 for mounting electrical components onto the PCB.

In the illustrated embodiment, the manufacturing facility 20 includes another SMT machine 34 that is positioned adjacent to the SMT machine 22, for example, due to the space limitations or efficiency in the manufacturing facility 20. Further, in the feeder arm 24 may extend into a walkway by a distance 42. As explained below, the feeder arm 24 may be rotated from the first position to a second position to have a lower profile when not in use for preparing the reel 32.

Figure 3:
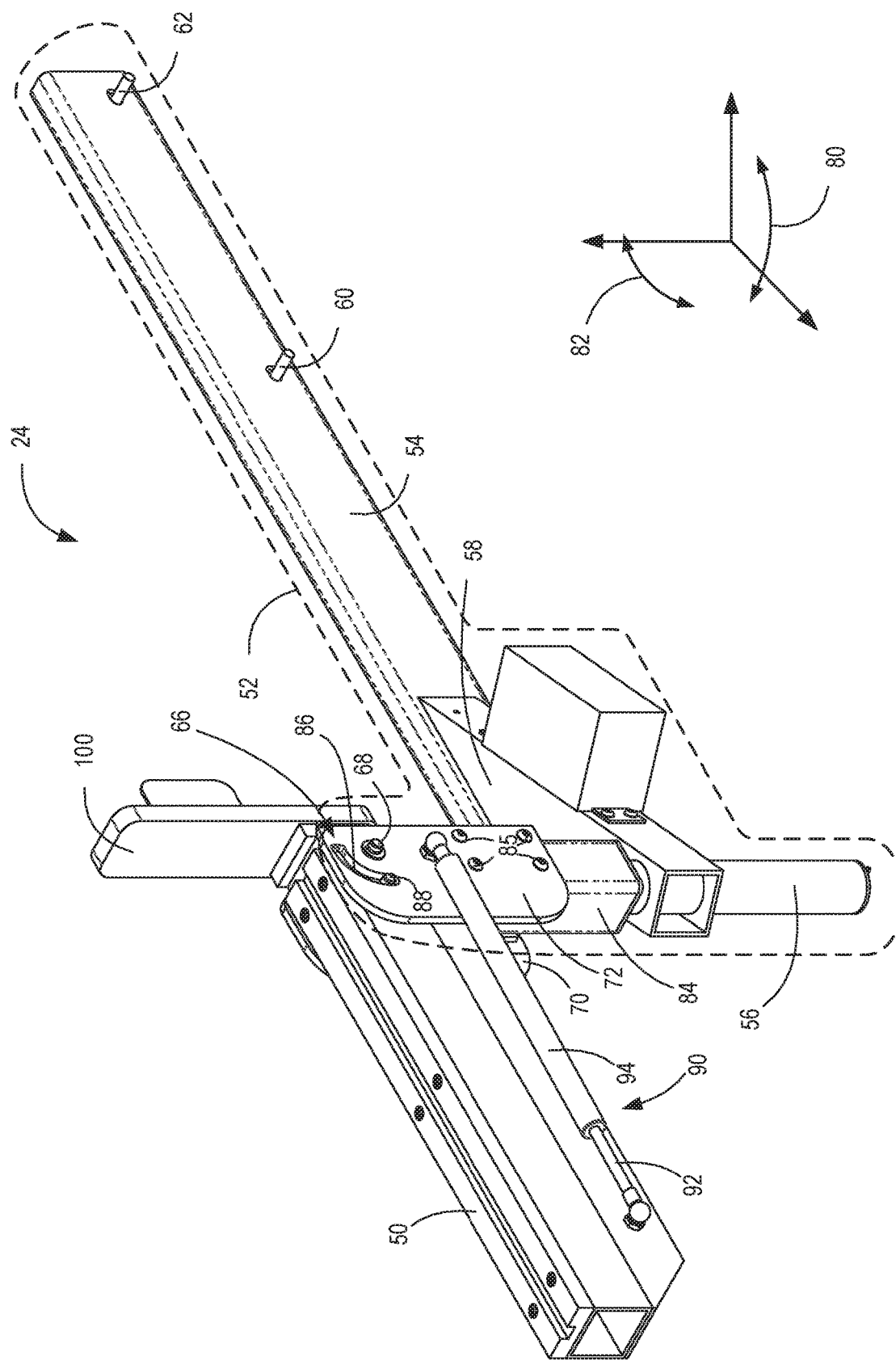
FIG. 3 illustrates a perspective view of the feeder arm of FIG. 1 in a first position, in accordance with an embodiment.

FIG. 3 is a perspective view of the feeder arm 24 in the first position. The feeder arm 24 includes a reel loading body 50 and a support body 52. The support body 52 includes an extending shaft 54, a support rod 56, and an angled support 58. The support body 52 may be fastened to the SMT machine 34 using fasteners 60 and 62 to support the reel and the reel loading body 50. The support rod 56 may be coupled to the extending shaft 54 (via the angled support 58) and may position the reel loading body 50 such that the reel is at a height convenient for loading reels. The angled support 58 may position the reel loading body 50 towards a front side of the SMT machine 22 to reduce the profile of the feeder arm 24 and to locate the feeder arm towards the front of the SMT machine 22.

The feeder arm 24 includes an articulating joint 66 that rotatably couples the reel loading body 50 to the support body 52 to allow the reel loading body 50 to rotate between the first position and a second position with respect to the support body 52. The articulating joint 66 may include a rotational pin 68 that forms a hinge joint between the reel loading body 50 and the support body 52. That is, the rotational pin 68 may rotatably couple the reel loading body 50 to the support body 52 to allow the reel loading body 50 to rotate with respect to the support body 52.

In the illustrated embodiment, the support shaft 56 includes guide plates 70 and 72 to guide the reel loading body 50 between the first position and the second position. That is, the guide plates 70 and 72 may limit azimuthal rotation 80 (e.g., side-to-side) of the reel loading body 50 while allowing zenith rotation 82 (e.g., up-and-down) of the reel loading body 50 with respect to the extending shaft 54. Further, the guide plates 70 and 72 may each include a rotational opening 86 and a bolt 88 to secure the rotation of the reel loading body 50 with respect to the support body 52. That is, the rotational opening 86 and the bolt 88 may block the reel loading body 50 from moving beyond the first position from the bolt 88 contacting a first end of the opening and block the reel loading body 50 from moving beyond the second position from the bolt 88 contacting a second end of the opening 86. The guide plates 70 and 72 may be fastened to a rectangular prism support structure 80 of the support shaft 56 via fasteners 85.

The feeder arm 24 may include a gas spring 90 that includes a piston 92 and a cylinder 94. The gas spring 90 biases the reel loading body 50 towards either the first position (when in a position closer to the first position than the second) or the second position (when in a position closer to the second position than the first) to prevent the reel loading body 50 from resting in a position therebetween. Further, the pneumatic cylinder 90 may dampen movement in the first position and the second position to reduce contact of the reel loading body 50 (e.g., to protect bolt 88).

The reel loading body 50 may include reel preparation circuitry 100 that electrically connects to the reel to allow the reel to be prepared. As mentioned above, this may be used to power up the reel assembly and allow an operator to rotate the reel into a correct starting position. Further, the preparation circuitry 100 may allow a user to set a pitch between the parts into memory of the reel before the reel assembly is inserted into the SMT machine 22. Upon inserting the reel into the SMT machine 22, the SMT machine 22 may access the memory of the reel to load the initial settings and pitch settings to correctly pick and place the initial electrical component and each subsequent electrical component. When not preparing a reel, the reel loading body 50 may be moved to a second position to store the reel loading body 50 with a lower profile from the SMT machine 22.

Figure 4:
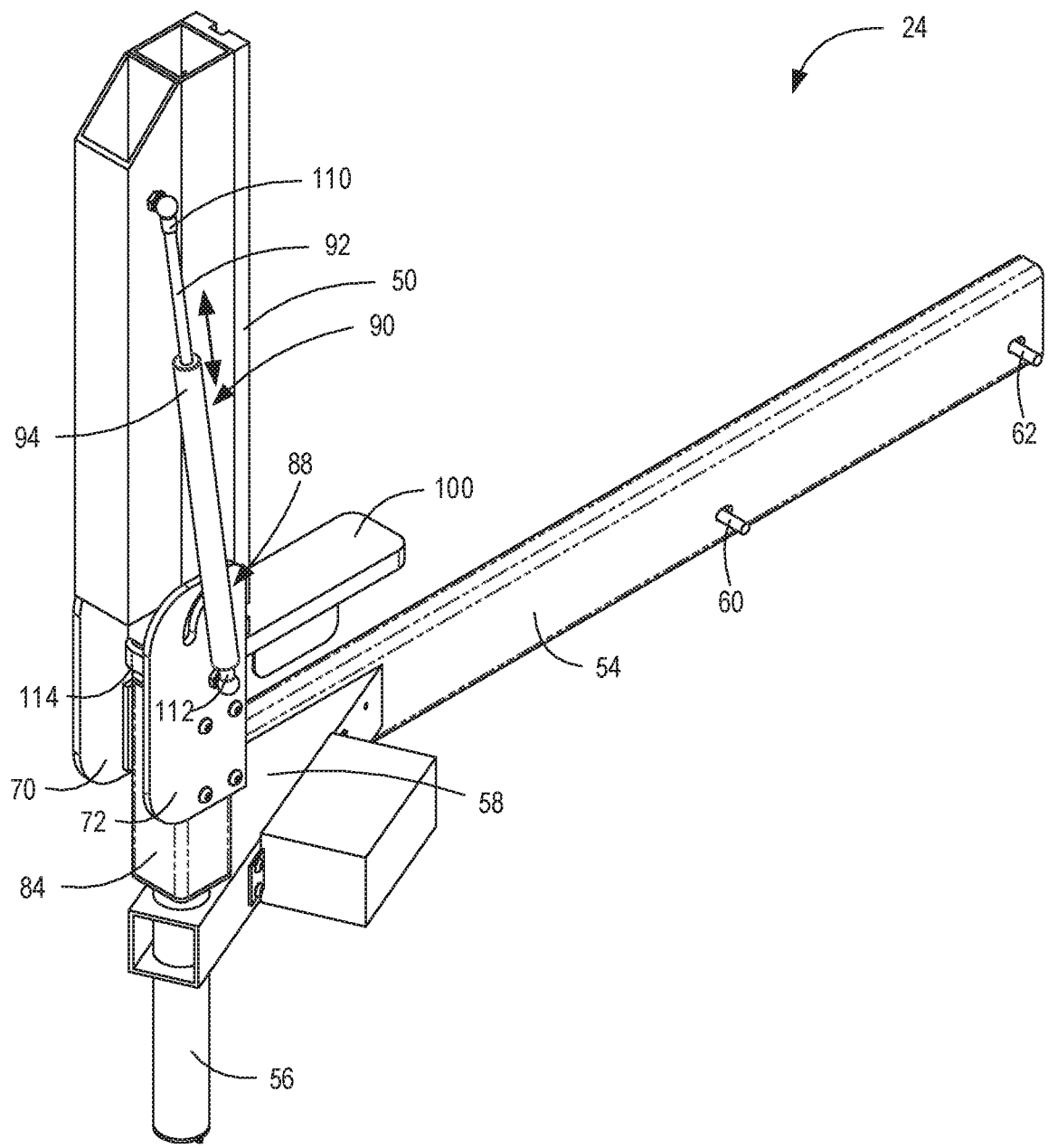
FIG. 4 illustrates a perspective view of the feeder arm of FIG. 1 in a second position, in accordance with an embodiment.

FIG. 4 is a perspective view of the feeder arm 24 raised into the second position with a lower profile from the SMT machine 22 than the first position, in accordance with an embodiment. That is, the reel loading body 50 may articulate between the first position (e.g., an extended position to prepare reels) and the second position (e.g., a lower profile position) via rotation of the rotational pin 68. In the illustrated embodiment, the bolt 88 rotates within the rotational opening 86 to allow an operator to lift the reel loading body 50 to the second position. As mentioned above, the gas spring 90 may dampen the motion of the reel loading body 50 as the reel loading body 50 approaches the second position. That is, ends 110 and 112 of the gas spring 90 may cause gas to compress in the cylinder from moving the reel loading body 50 which may dampen the force exerted when moving the feeder arm 24 between positions, which reduces forces against the feeder arm 24 to improve the longevity of the feeder arm 24.

In the illustrated embodiment, the guide plates 70 and 72 form an opening 114 with the support structure 84 to allow the preparation circuitry 100 to pass therebetween when in the second position. Further, a width of the rectangular prism support structure 84 may be sized (e.g., of equal or greater size) according to the preparation circuitry 100 to allow the protection circuitry 100 to pass between the guide plates 70 and 72 and into the opening 114 between the rectangular prism support structure 84 and the reel loading body 50.

Figure 5:
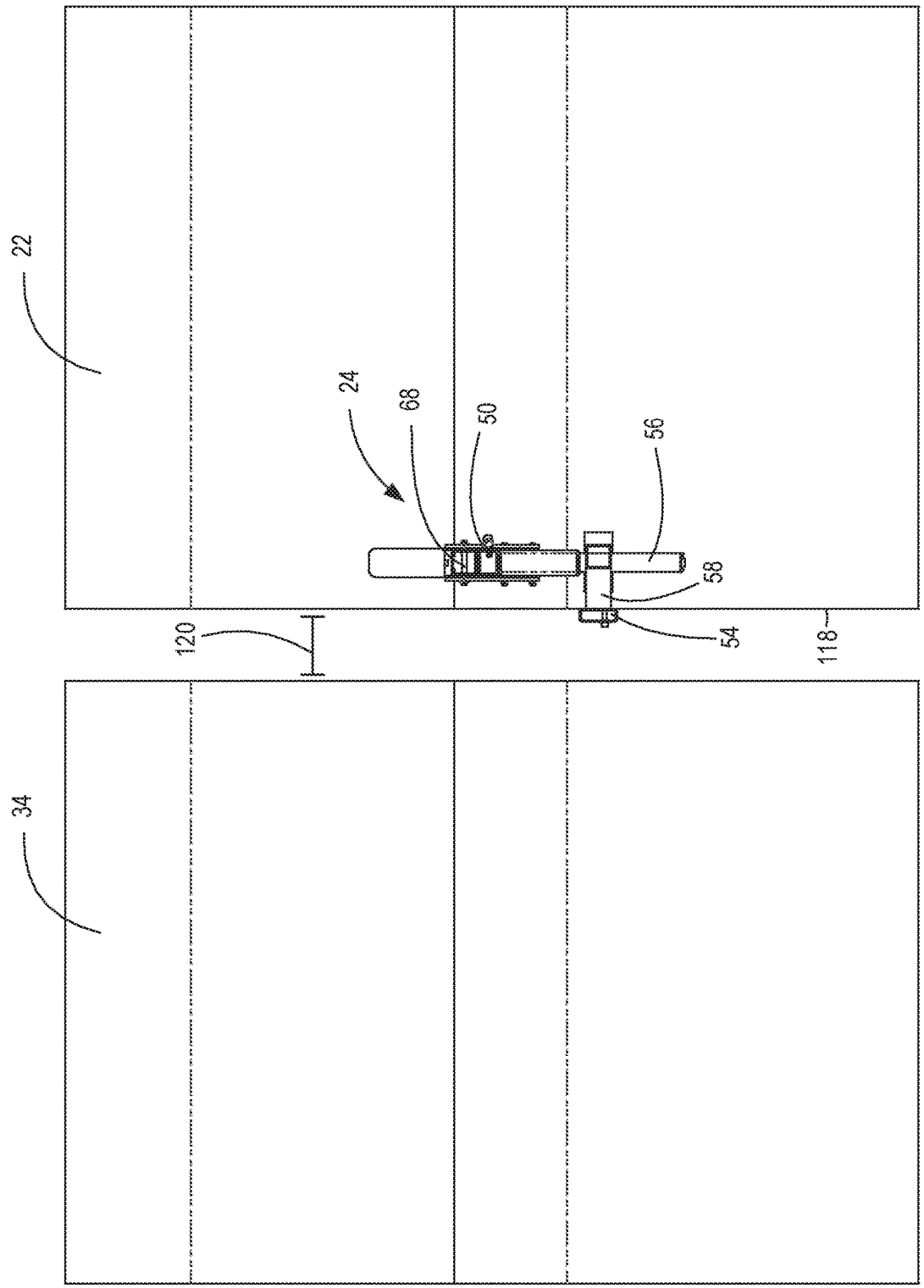
FIG. 5 illustrates a front view of the SMT machine of FIG. 2 with the feeder arm in the second position, in accordance with an embodiment.

FIG. 5 shows a front view of the SMT machine 22 with the feeder arm 24 in the second position, in accordance with an embodiment. As mentioned above, the angled support 58 may position the reel loading body 50 towards the front of the SMT machine 22. The support arm 54 may have a low profile (e.g., a width of the support arm) extending from side 118 of the SMT machine 22 such that another SMT machine 34 may be positioned adjacently to reduce the distance 120 between the SMT machines 22 and 34, thereby reducing the overall space in the manufacturing facility 20 that is used for surface mounting.

FIG. 6 is a side view of the SMT machine 22 with the feeder arm 24 in the first position, in accordance with an embodiment. The feeder arm 24 may extend a first distance 140 from the SMT machine 22 when in the first position and extend a second distance 142 from the SMT machine 22 when in the second position, less than the first position. By reducing the space taken by the SMT machine 22 when not in use, the SMT machine 22 manufacturing facilities may better utilize limited space.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A feeder arm for a surface mount technology (SMT) machine, comprising:
  a support body configured to be fastened to the SMT machine;
  a reel loading body configured to support a reel of electrical components to allow the reel of electrical components to be prepared for installation on the SMT machine;
  preparation circuitry configured to electrically connect to the reel of electrical components to allow the reel of electrical components to be prepared; and an articulating joint between the reel loading body and the support body, wherein the articulating joint is configured to allow the reel loading body to rotate between a first position and a second position.

2. The feeder arm of claim 1, wherein the first position comprises a position in which the reel loading body allows the reel of electrical components to be prepared, and wherein the second position comprises a position in which the reel loading body has a lower profile from the SMT machine than when the reel loading body is in the first position.

3. The feeder arm of claim 1, wherein the support body comprises openings configured to receive fasteners to secure the support body to the SMT machine.

4. The feeder arm of claim 1, wherein the articulating joint comprises a bolt and an opening configured to block the reel loading body from moving beyond the first position by the bolt contacting a first end of the opening and to block the reel loading body from moving beyond the second position by the bolt contacting a second end of the opening.

5. The feeder arm of claim 1, wherein the articulating joint comprises a rotational pin configured to rotatably couple the reel loading body to the support body.

6. The feeder arm of claim 1, wherein the support body comprises an extending shaft configured to be coupled to a lateral side of the SMT machine and the support body, orthogonal to the extending shaft, that positions the height of the reel loading body to allow operators to load the reel of electrical components.

7. The feeder arm of claim 1, comprising first guide plate and a second guide plate, wherein the first guide plate and the second guide plate are configured to limit azimuthal rotation of the reel loading body with respect to the support body while allowing zenith rotation of the reel loading body between the first position and the second position.

8. The feeder arm of claim 1, comprising a gas spring coupled between the reel loading body and the support body, wherein the gas spring arm is configured to bias the reel loading body to the first position when the reel loading body is angled closer to the first position and to bias the reel loading body to the second position when the reel loading body is angled closer to the second position.

9. The feeder arm of claim 8, wherein the pneumatic cylinder is configured to dampen movement of the reel loading body to reduce contact forces on the reel loading body.

\* \* \* \* \*